United States Patent [19]

Nelson

[11] 4,292,515
[45] Sep. 29, 1981

[54] RECONFIGURABLE PHOTO-ELECTRIC KEYBOARD HAVING REMOVABLE KEYS

[75] Inventor: Edward I. Nelson, Sunrise, Fla.

[73] Assignee: Burroughs Corporation, Detroit, Mich.

[21] Appl. No.: 75,370

[22] Filed: Sep. 14, 1979

[51] Int. Cl.³ .............................................. G01D 5/34
[52] U.S. Cl. .................................................. 250/229
[58] Field of Search ............................... 254/221, 229; 235/145 R; 178/17 C, 17 D; 340/365 P, 365 R, 365 L, 365 C; 400/479, 491.3

[56] References Cited

U.S. PATENT DOCUMENTS

3,787,837  1/1974  Allen et al. ........................ 250/229
4,202,640  5/1980  Schmidt et al. ................. 340/365 R

*Primary Examiner*—David C. Nelms
*Attorney, Agent, or Firm*—David G. Rasmussen; Kevin R. Peterson; Edmund M. Chung

[57] ABSTRACT

The invention relates to a reconfigurable photo-optical keyboard having removable keys. The keystem of each key is shaped to the key apertures in the keyboard housing. At least one of the sidewalls of the keystem has one or more flexible fingers which have terminal ends at the bottom of the key. There are retainer flanges at the terminal ends. The retainer flanges lock beneath the bottom surface of the optical keyboard when the key is inserted. The flexible fingers are resilient enough to allow the flanges to release and the keys to be removed from the apertures with a strong pulling pressure. Thus, additional keys can be incorporated into an existing keyboard or unused keys removed.

6 Claims, 13 Drawing Figures

RECONFIGURABLE PHOTO-ELECTRIC KEYBOARD HAVING REMOVABLE KEYS

BACKGROUND OF THE INVENTION

1. Field of the Invention

The invention relates to a photo-optical keyboard. More specifically the invention relates to reconfigurable photo-optical keyboards having removable keys.

2. Description of the Prior Art

One of the problems with keyboards is that the keys are fixed in the keyboard at least semi-permanently and the keyboard must be taken apart to get them out. If a keyboard is to be expanded or made smaller it must be taken apart to put new keys in and to take others out. Many times the keyboard housing must be changed.

The keys of the prior art show a variety of schemes for retaining the key in the housing. All are semi-permanently mounted. Most keys use the cover of the keyboard to restrain the keys from coming out. Examples are U.S. Pat. Nos. 3,603,982 and 3,856,127. Another key shown in U.S. Pat. No. 3,737,668 has flanges on the keystem holding the key into the keyboard. However, the key is mounted semi-permanently and cannot be removed easily.

SUMMARY OF THE INVENTION

The present invention provides a key which may be removed from the top of the keyboard simply by pulling it out of the keyboard apertures. Conversely, additional keys can readily be added to the keyboard by pushing them into the key apertures. The keyboard has extra apertures which are unused portions of the existing optical matrix. The decoding electronics can be set for the maximum number of key positions. However, the unused positions never become actuated where keys are missing but are ready when keys are added. This allows for a cheap easily reconfigurable keyboard.

The key has a keystem shaped to the key apertures. At least one of the sidewalls of the keystem has one or more flexible fingers each with a retainer flange. The retainer flange fastens the key into the apertures. The flexible fingers are resilient enough to allow the flanges to release and the key to be removed from the aperture.

One novel feature of the invention is the key having flexible fingers with retainer flanges. A second novel feature is the combination of the key and a molded plastic keyboard having an excess of apertures. These features allow for a cheap easily expandable keyboard.

The subject matter of this application is related to the subject matter of co-pending U.S. Patent Application entitled "Molded Plastic Photo-Optical Keyboard", by Edward Nelson, and "Photo-Optical Keyboard Having N-Key Rollover", by Edward Nelson, John Lane and Harry Mueller, filed concurrently with the present application and assigned to the same assignee as the present invention.

DETAILED DESCRIPTION OF THE PREFERRED EMBODIMENT(S)

Figure 1:
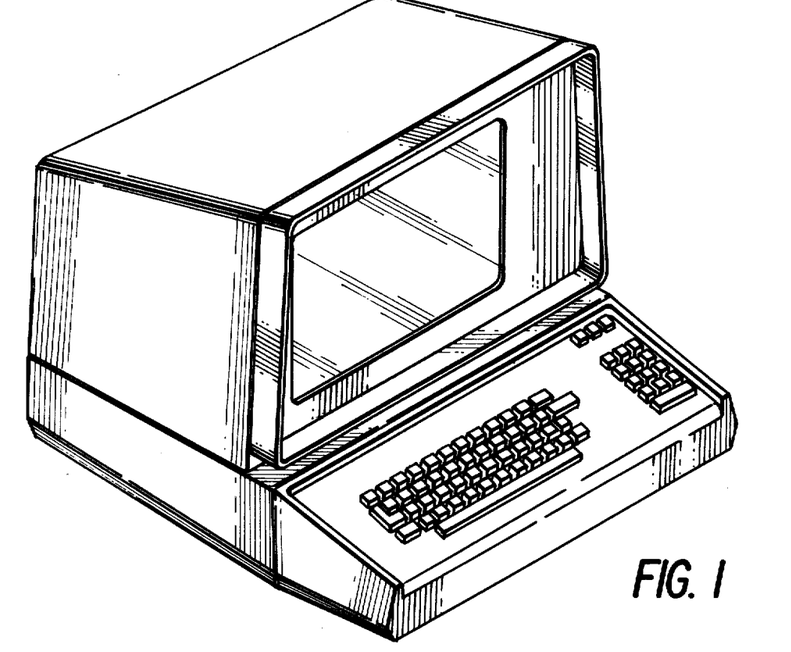
FIG. 1 is a perspective view of a CRT display terminal having photo-optical keyboard.

FIG. 1 shows a typical operator terminal for a computer, word processor, or like type system. The terminal may, for example, have the characteristics of a typewriter and a calculator. The keys may be in a rectangular matrix as the calculator keys or in a staggered offset matrix as the typewriter keys. All of the keys are located on one keyboard which has an excess capacity of key locations and is easily changeable. To reconfigure the keyboard, the only change that need be made is the insertion of additional keys or the removal of excess keys together with changing of the faceplate.

Figure 2:
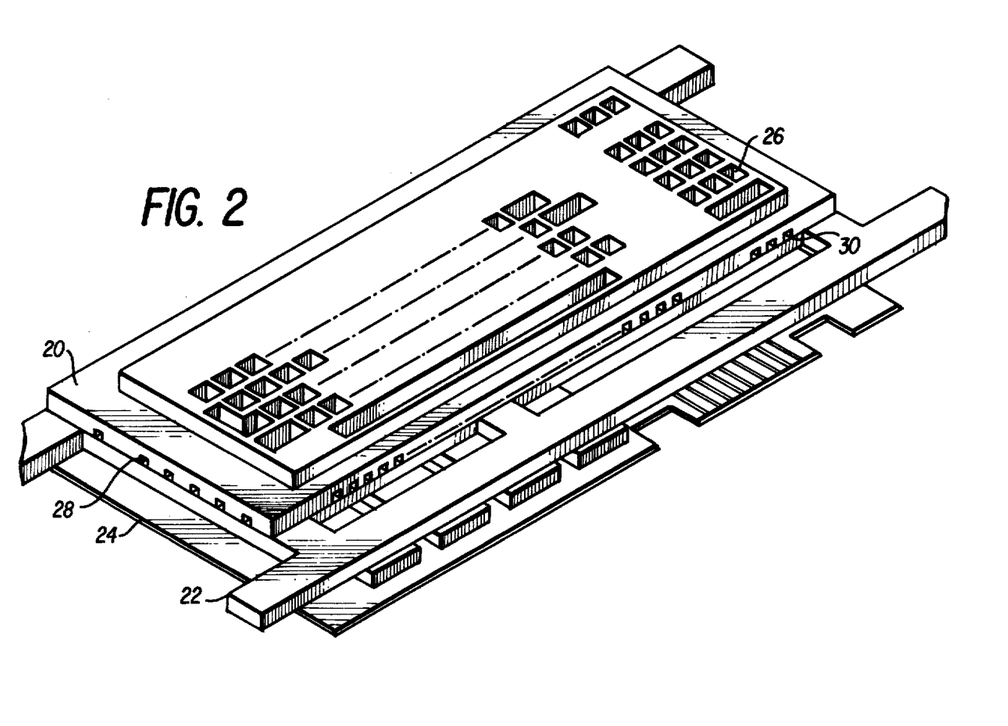
FIG. 2 is a perspective view of the photo-optical keyboard assembly of FIG. 1 having keys, faceplate and CRT removed.

FIG. 2 shows the keyboard of FIG. 1 with the faceplate and keys removed. The keyboard consists of a keyboard housing 20, a baseplate 22, and a printed circuit board 24. Printed circuit board 24 is attached to baseplate 22 by appropriate fasteners (not shown). Keyboard 20 has rectangular apertures into which keys will fit. Only a few apertures are shown for illustration purposes, however, normally the whole raised portion of keyboard housing 20 is taken up with apertures. At the base of keyboard housing 20 are shown optical passages or light channels. Light channels 28 extend along one axis and light channels 30 extend along the other axis. Light channels 28, 30 are entirely in the bottom surface of keyboard housing 20. Light channels 28 extend between all of the apertures in each row. Light channels 30 extend between all of the apertures in each column. An illumination source such as a light, light emitting diode, or fiber optic bundle is placed at one end of light channels 28, 30 and photo-receptors are placed at the other end. These are not shown.

Printed circuit board 24 contains all of the decoding and electronic circuitry necessary for the keyboard. This all may be done with conventional circuitry.

Figure 3:
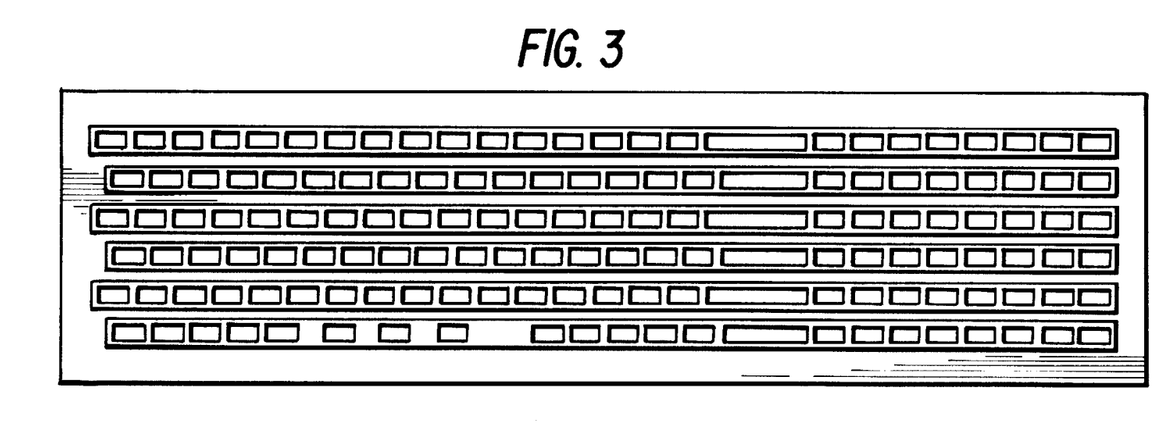
FIG. 3 is a plan view of a keyboard housing having key apertures in a rectangular matrix and a diagonal matrix.

FIG. 3 shows a more detailed top view of the key aperture arrangement on a typical keyboard housing 20 of FIG. 2. The leftmost group of keys are in a diagonal (offset) matrix characteristic of a typewriter keyboard. The group of keys on the right are in a rectangular matrix typical of calculator keys.

Figure 4:
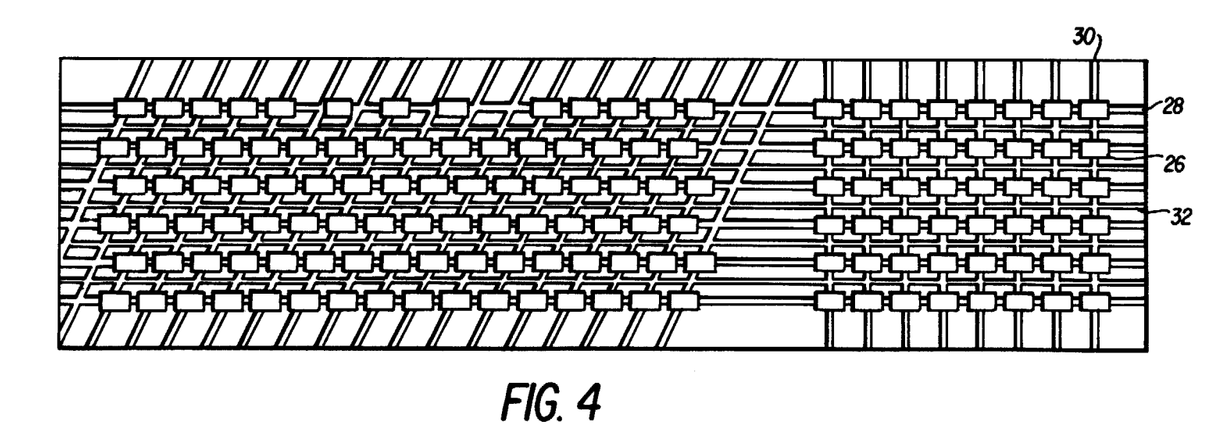
FIG. 4 is a bottom view of the keyboard housing of FIG. 3 showing light channels for both the diagonal matrix and the rectangular matrix.

FIG. 4 shows a bottom view of the keyboard housing of FIG. 2. The bottoms of the apertures 26 in both the diagonal and the rectangular matrixes have light channels 28, 30 for the rows and columns respectively. Between each of the rows are light isolation barrier channels 32 which are molded into the bottom of the keyboard housing.

Figure 5:
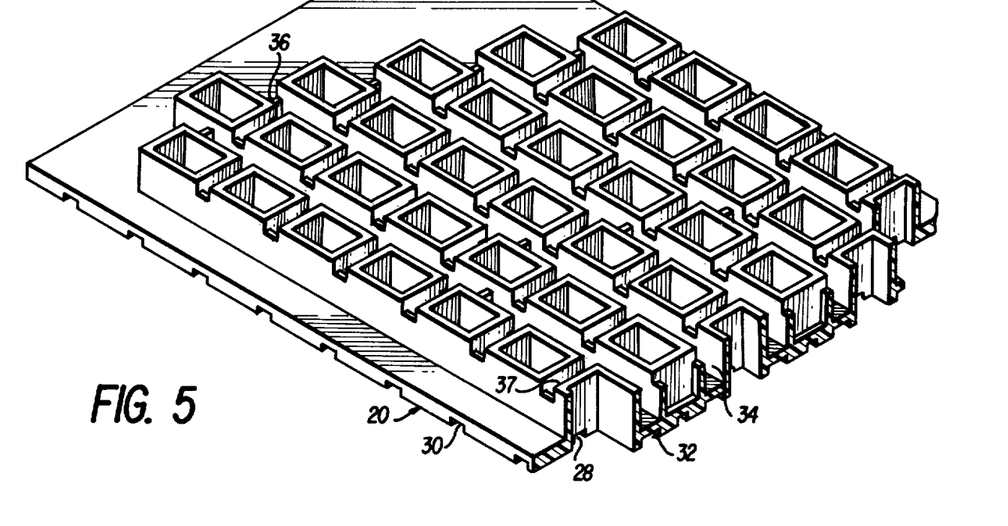
FIG. 5 is a perspective partial sectional view of the diagonal matrix portion of the keyboard housing of FIG. 3.

FIG. 5 shows a sectional view of the keyboard housing 20. Light channels 28 and 30 are at the bottom of the keyboard housing. These channels may be of the order of 3/32 inch in depth. Light isolation barrier channels 32 between the rows are at the bottom of the keyboard housing. Between the rows of apertures are recesses 34 and structural supports 36. The structural supports are below the top surface of keyboard housing. Between columns of apertures 26 are recesses 37. The sidewalls of recesses 37 are lower than the sidewalls of apertures 26. Recesses 34, 37 are to catch accidental spills on the keyboard.

Figure 6:
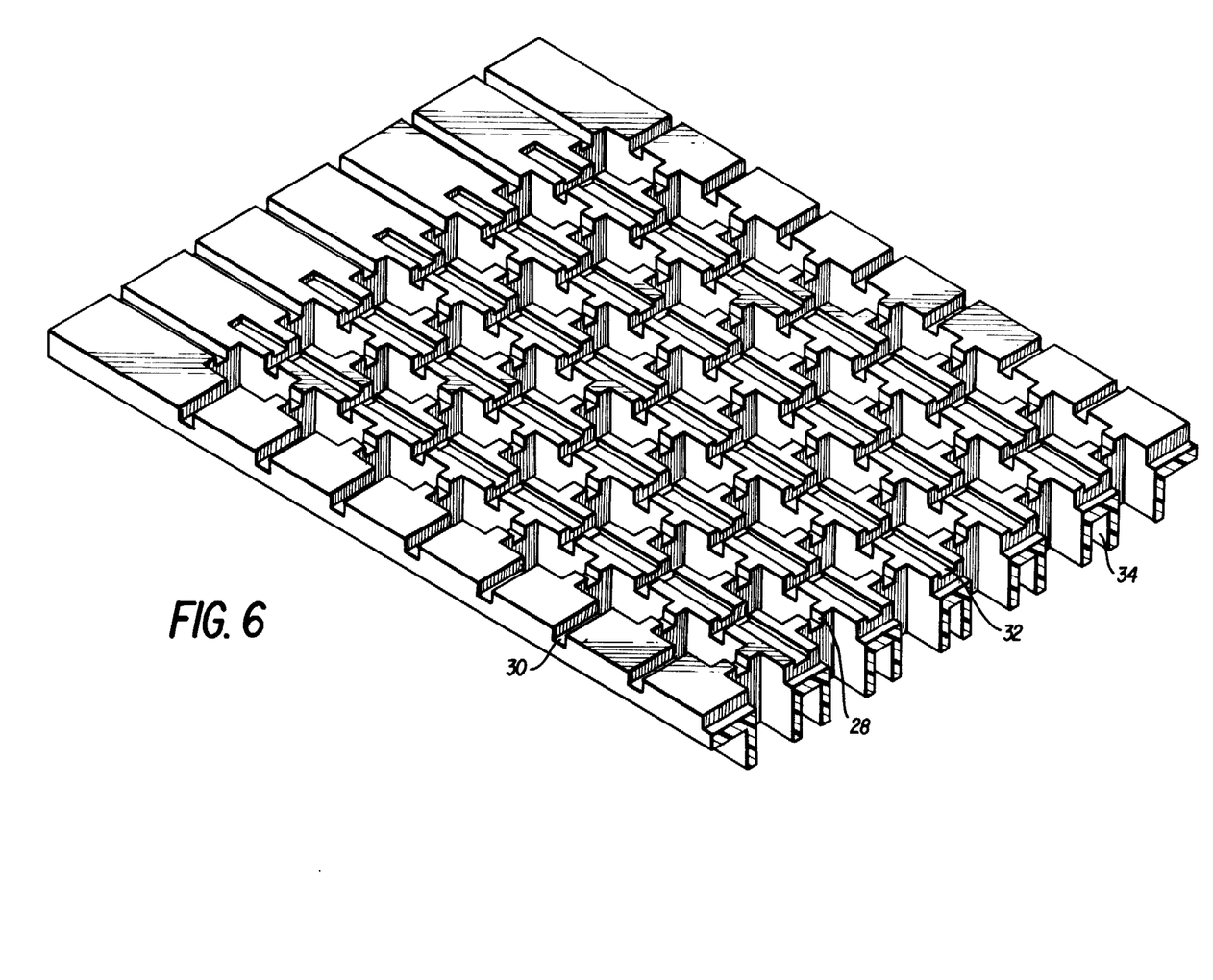
FIG. 6 is a perspective partial sectional view of the bottom of the rectangular matrix portion of the keyboard housing of FIG. 4.

FIG. 6 shows a sectional bottom view of the keyboard housing. Light channels 28 and 30 are open to the bottom of the keyboard housing. Likewise, light isolation channels 32 are also open to the bottom of the keyboard housing. Recesses 34 may also be seen.

The light channels, light isolation barrier channels, and apertures orientations allow the keyboard housing to be molded from plastic in a single molding operation.

Figure 7:
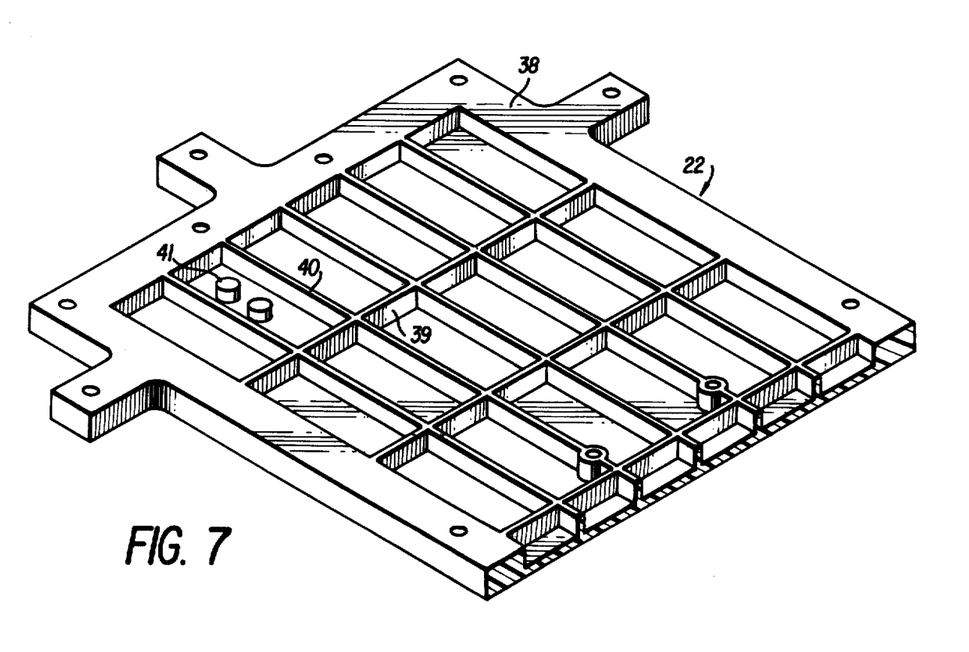
FIG. 7 is a perspective partial sectional view of the baseplate of the keyboard assembly of FIG. 2.

FIG. 7 shows base plate 22 of the keyboard. The outer edge 38 will fit flush to the bottom of keyboard housing 20. The inner portion of base plate 22 is recessed with light isolation barriers 40 (i.e. ribs) running in the direction of the rows. Structural supports 39 run in the direction of the columns. The light isolation barriers 40 are intended to fit up into light isolation channels 32 (shown in FIG. 6). The light isolation barriers are required to prevent the divergent light from one row from impinging on a photoreceptor for another row. The rows are long, of the order of 20 inches, and light divergence is large, therefore, the light isolation barriers are needed. On the other hand the columns are short, of the order of 4 inches, and light divergence is smaller so the barriers are not needed. The ribs have been added at intervals of every two or three columns only for strength. Projections 41 (only two are shown) are spring retainers which are placed at a location below each aperture 26 of the keyboard. The structure of base plate 22 may be molded from plastic in a one piece molding operation.

Figure 8:
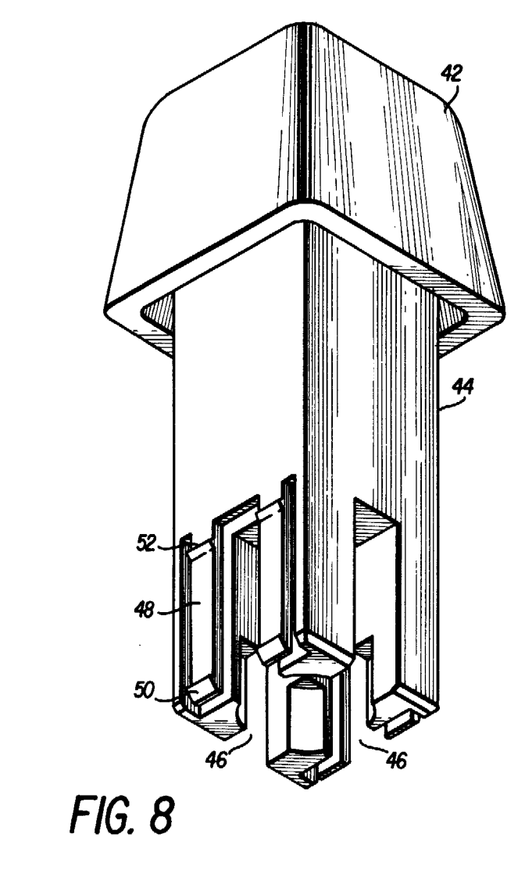
FIG. 8 is a perspective view of a key used in the keyboard assembly of FIG. 2.

FIG. 8 shows a key for use in keyboard housing 20. The key has an umbrella shaped head 42 and a large rectangular keystem 44. The key has vertical slots 46 in each of the four sidewalls which open up to the bottom of the key. The inner portion of the key is cut away to allow the key to fit over spring retainer 41 of base plate 22. At two of the edges of the key are flexible fingers 48. At the bottom of each of these flexible fingers is a flange 50. Also on each flexible finger is a small ridge 52. The way in which light slots 46 are constructed, being open at the bottom, makes the key top and stem well suited for being molded in a one-piece process. The key is made of a high wear material such as acetel plastic. An example is Delrin manufactured under trademark to DuPont.

Figure 9:
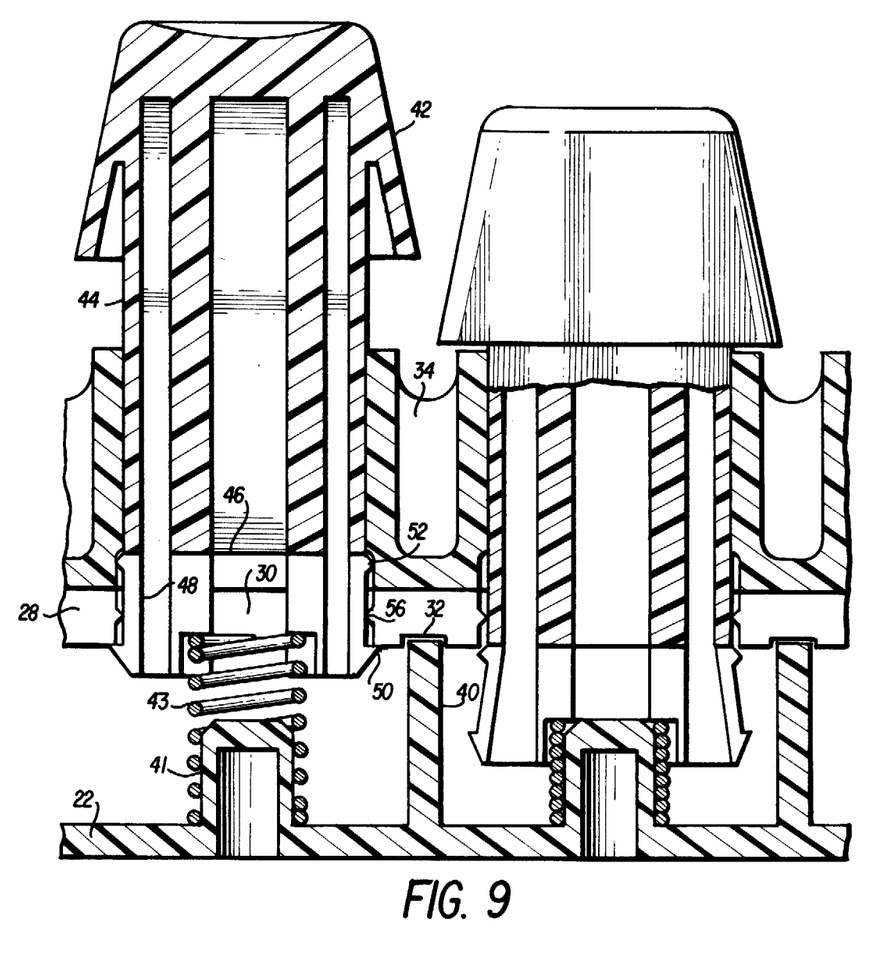
FIG. 9 is a sectional view of the keys shown in FIG. 8 in both the depressed and normal positions.

FIG. 9 shows a sectional view of the key of FIG. 8 in place in keyboard housing 20. One key is shown in the normal "up" position and the other key is shown depressed. The head of key 42 extends over recess 34. This allows any liquid spills on the keyboard to be trapped in recesses 34 rather than draining into the keyboard. Keystem 44 extends through aperture 26. The inner surface of aperture 26 has ridges 56. These ridges are meant to contact ridges 52 on flexible fingers 48 of the key to provide a tractile feel to the key when it is depressed. The flexible fingers allow the ridges to pass after contact is made. The exact pressure needed for the tactile feel may be predetermined by changing the slope of ridges 52, 56. At the end of flexible fingers 48 are flanges 50 which serve as stops to prevent the key from being pushed out of the keyboard housing by the return spring. The flexibility of finger 48 allows the key to be withdrawn easily for replacement. During the key withdrawal the flexible finger flexes inwardly to allow the key to come out. The flanges 50 could be mounted directly to the sidewalls of the key if the sidewalls have enough resilience to flex inward to allow the key to come out.

Light channel 28 is shown extending from left to right across FIG. 9. Light channel 30 comes out of the drawing and is in the same plane as light channel 28. Slot 46 is molded so that a portion of the opening is above the level of light channel 30. This allows for a small amount of free travel of the key, about 3/32 of an inch before a key depression is registered. The remaining 3/32 travel of the key is for actuation of the key. This allows an operator to keep a finger on the key with a slight pressure even when not intending to depress the key (touch typing).

Spring retainer 41 is a raised projection from baseplate 22. The spring retainer prevents slippage and buckling of spring 43. Umbrella cap 42 contacts keyboard housing 20 and prevent keystem 44 from being depressed all the way to the bottom of plate 22. This is shown in the figure at the right. Light isolation barriers 40 extend up into light isolation barrier channels 32.

In operation the photo-optical keyboard generally operates the same as prior art photo-optical keyboards. The principles are the same and the circuitry and decoding logic may be of a conventional type. What differs about the present invention is the simplification of the retaining mechanism on the keys to allow the key to be easily inserted or removed from the top and thus create an easily expandable keyboard.

One advance in the key is using flexible fingers with retainer flanges at the ends of the fingers. This locking arrangement allows the keys to be easily removed. Furthermore the key can be molded from plastic in a single operation thus making the key inexpensive.

A second advance is the use of the key having the flexible fingers with retainer flanges in combination with the keyboard having an excess of key apertures. The keys are easily removed and inserted into the keyboard housing from the top. This means the keyboard need not be taken apart to change keys. All that needs to be done is to modify or replace the faceplate. In addition, the keyboard housing and keys are cheaply molded from plastics thus substantially reducing the cost and complexity of the keyboard.

Figure 10:
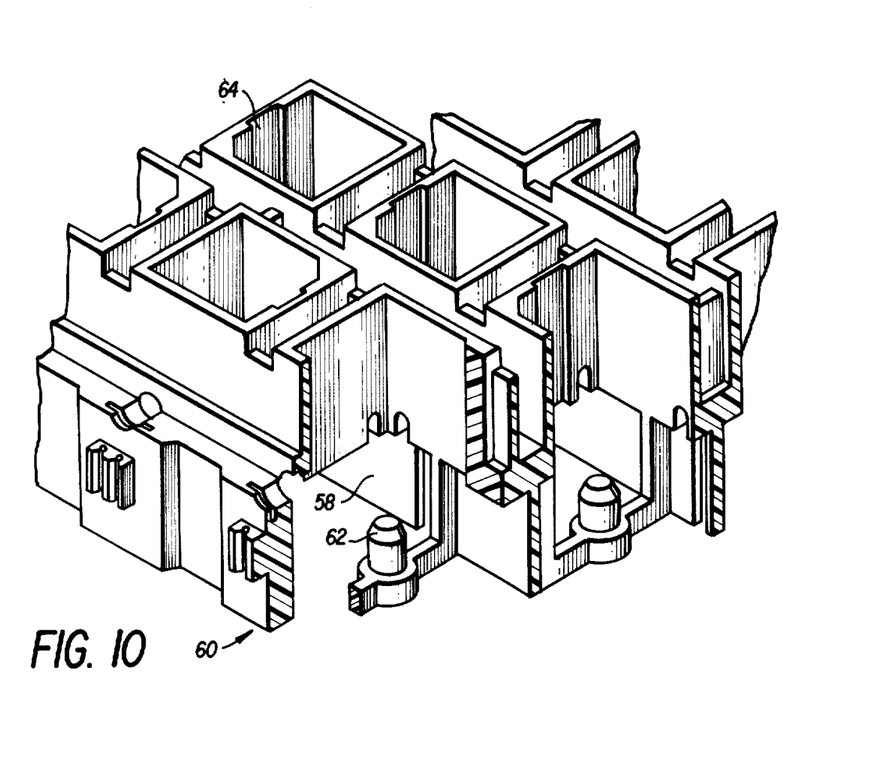
FIG. 10 is a perspective partial sectional view of an alternative keyboard housing.

An alternative embodiment of the apparatus shown in FIGS. 1–9 is shown in FIG. 10. This embodiment is simpler in structure and is preferred under some circumstances. In this embodiment light isolation barriers 58 extend downward from keyboard housing 60. This is in contrast to the previous embodiment where the light isolation barriers 42 extend up from the base plate 22 (shown in FIG. 7). By molding the light isolation barriers 58 as part of the keyboard housing 60 the need for a base plate is eliminated. The spring retainers 41 of base plate 22 (FIG. 7) are replaced by spring retainers 62 which are supported between the light isolation barriers 58.

Channels 64 for the inclusion of tactile ridges have been added. A tactile ridge is in each channel near the bottoms of the key apertures.

Figure 11:
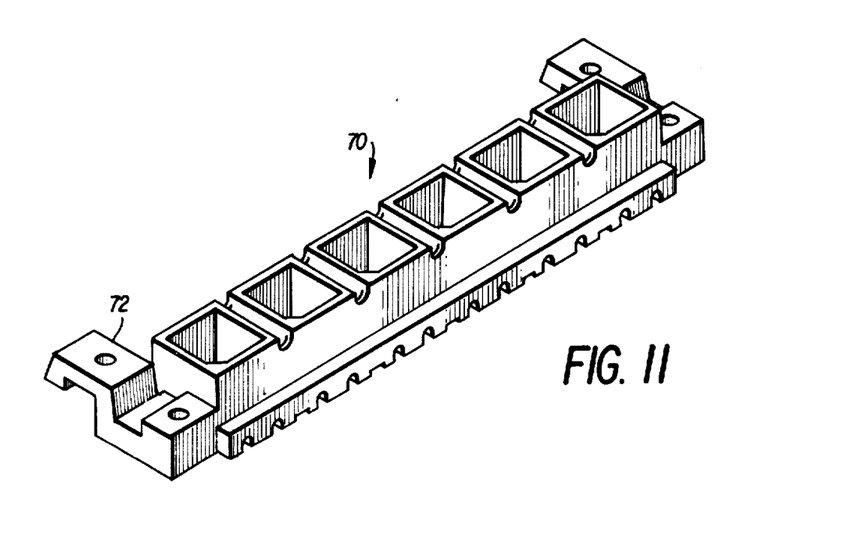
FIG. 11 is a perspective view of a column of key apertures capable of being added to an existing keyboard.

A second alternative embodiment to the invention is shown in FIG. 11. This embodiment is a column (or row) of apertures 70 which may be added to the existing keyboard housing of FIG. 10. Locking arms 72 have mating pieces on the keyboard housing, so that columns of apertures 70 may be simply attached. All light channels, apertures, and other structures are compatible with the keyboard housing. The locking arms are constructed so that they may be connected in series thus allowing keyboard expansion to any size.

Figure 12:
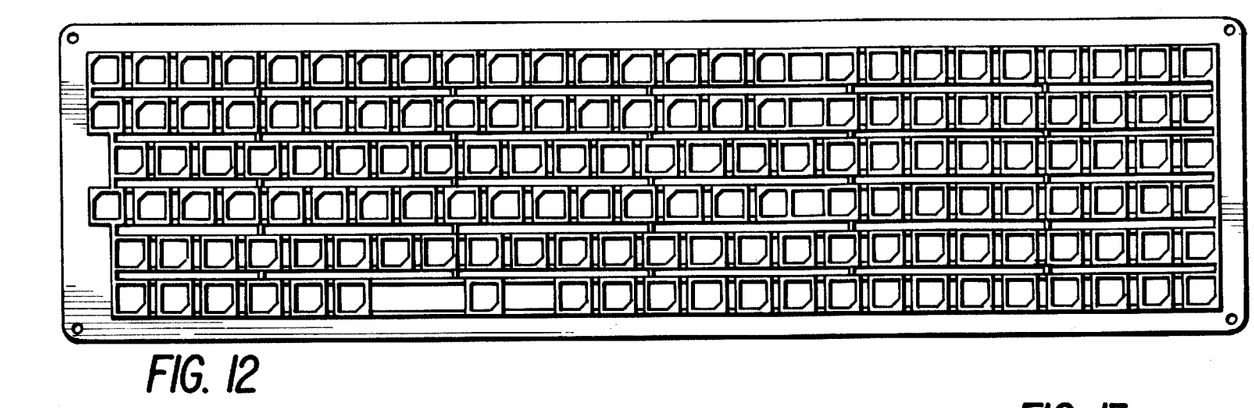
FIG. 12 is a plan view of an alternative layout of key apertures and light channels in a keyboard housing.
Figure 13:
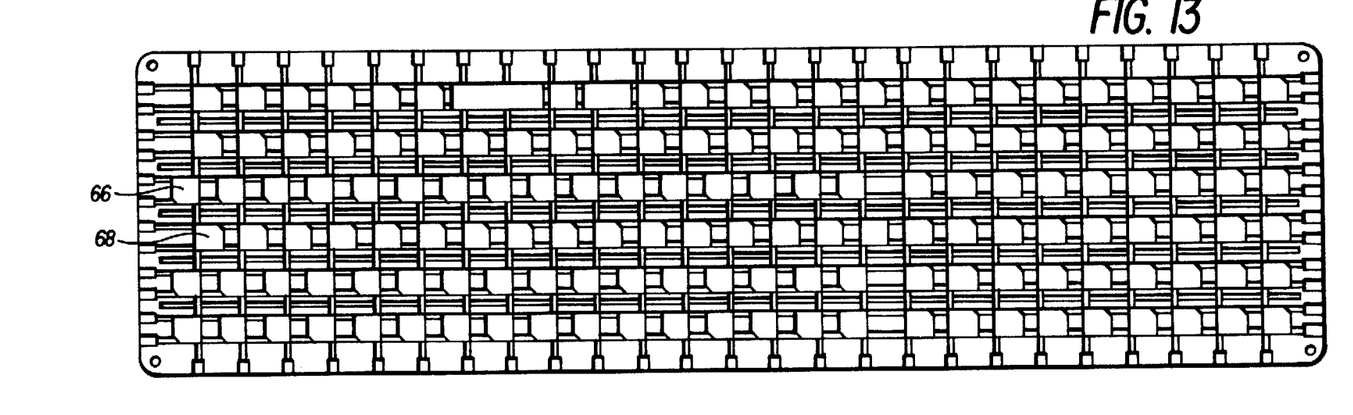
FIG. 13 is a bottom view of the keyboard housing of FIG. 12.

A third embodiment of the invention is shown in FIGS. 12 and 13. This embodiment shows an alternative way of arranging the light channels and key apertures that are shown in FIGS. 3 and 4. In FIGS. 12 and 13 channels are all in a rectangular matrix. A staggered arrangement for keys may be accomplished by placing the key apertures on alternate sides of a light channel as is shown by key apertures 66, 68 of FIG. 13. This simplifies the design of the molds needed to produce the keyboard housing. Furthermore, the same key can be used in either key aperture 66 or 68. The key need only be turned 180° to fit one or the other. The structure of the keyboard shown in FIG. 10 may be used for the keyboard layout of FIGS. 12 and 13. This embodiment provides simplified and shorter optical paths.

What is claimed is:

1. A photo-optical keyboard having apertures for keys comprising:
    a key having a keystem with sidewalls shaped to said apertures, at least one of said sidewalls having at least one flexible portion with a retainer flange thereon, said retainer flange serves as a stop restricting the upward motion of said key in said aperture said flexible portion having the resilience to allow said keys to be withdrawn from said aperture by hand pressure.

2. A photo-optical keyboard having apertures for keys comprising:
    a key having a keystem with sidewalls shaped to said apertures, at least one of said sidewalls having at least one flexible finger with a retainer flange thereon, said retainer flange serves as a stop restricting the upward motion of said key in said aperture, said flexible fingers having the resilience to allow said keys to be withdrawn from said aperture by hand pressure.

3. The apparatus of claim 2 in which said keystem is molded plastic with the terminal end of said flexible fingers opening up to the bottom of the key, the retainer flanges being at said terminal end said retainer flange fastening to the bottom surface of said photo-optical keyboard.

4. An expandable photo-optical keyboard comprising:
    a keyboard housing having a matrix of rows and columns of apertures for keys;
    a key having a keystem with sidewalls shaped to said apertures, at least one of said sidewalls having flexible fingers each with a retainer flange thereon, the terminal end of said flexible fingers opening up to the bottom of the key, said retainer flanges being at said terminal end, said retainer flange serving as a stop when contacting the bottom surface of said keyboard housing with said flexible fingers having the resilience to allow said keys to be unfastened and removed from said aperture by hand pressure, whereby said keys may be removed and inserted from the top of said keyboard to provide a reconfigurable keyboard.

5. The apparatus of claim 4 further comprising a unitary molded plastic piece having apertures for keys and locking arms, said locking arms mounting to mating locks on said keyboard to expand said keyboard by adding a column of apertures, said locking arms being able to lock to other locking arms serially.

6. An expandable photo-optical keyboard comprising:
    a keyboard housing having a matrix of rows and columns of apertures for keys, the underside of said housing having one or more light channels for each row passing between the apertures for each row and one or more light channels for each column passing between the apertures for each column, said light channel opening up at the underside surface of said housing;
    light isolation barriers positioned beneath said keyboard housing between said rows and extending downward to prevent crossover of light between said rows; and
    a key housing having a keystem with sidewalls, shaped to said apertures, at least one of said sidewalls, having flexible fingers each with a retainer flange thereon, the terminal end of said flexible fingers opening up to the bottom of the key, said retainer flanges being at said terminal ends, said retainer flange serving as a stop when contacting the bottom surface of said keyboard housing with said flexible fingers having the resilience to allow said keys to be unfastened and removed from said aperture by hand pressure whereby said keys may be removed and inserted from the top of said keyboard to provide an expandable keyboard.

* * * * *